US008877605B1

(12) United States Patent
Xie et al.

(10) Patent No.: US 8,877,605 B1
(45) Date of Patent: Nov. 4, 2014

(54) SILICON SUBSTRATE FABRICATION

(71) Applicants: Yonglin Xie, Pittsford, NY (US); Carolyn R. Ellinger, Rochester, NY (US); Mark D. Evans, Rochester, NY (US); Joseph Jech, Jr., Webster, NY (US)

(72) Inventors: Yonglin Xie, Pittsford, NY (US); Carolyn R. Ellinger, Rochester, NY (US); Mark D. Evans, Rochester, NY (US); Joseph Jech, Jr., Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 13/860,557

(22) Filed: Apr. 11, 2013

(51) Int. Cl.
*H01L 21/76* (2006.01)
*B41J 2/16* (2006.01)

(52) U.S. Cl.
CPC .................................... *B41J 2/1626* (2013.01)
USPC ........... 438/424; 438/427; 438/443; 438/444; 257/E21.004; 257/E21.345

(58) Field of Classification Search
None
See application file for complete search history.

(56) References Cited

U.S. PATENT DOCUMENTS

| | | | | |
|---|---|---|---|---|
| 7,208,800 | B2 | 4/2007 | Chung et al. | |
| 8,519,478 | B2 * | 8/2013 | Rassel et al. | 257/335 |
| 8,541,820 | B2 * | 9/2013 | Hayasaki et al. | 257/225 |
| 2009/0096835 | A1 | 4/2009 | Nagata | |
| 2009/0147049 | A1 | 6/2009 | Lee et al. | |
| 2009/0273647 | A1 | 11/2009 | Kwon et al. | |

FOREIGN PATENT DOCUMENTS

| | | |
|---|---|---|
| CN | 102344114 | 2/2012 |

* cited by examiner

*Primary Examiner* — Zandra Smith
*Assistant Examiner* — Khanh Duong
(74) *Attorney, Agent, or Firm* — William R. Zimmerli

(57) ABSTRACT

A method of etching a silicon substrate includes providing a silicon substrate including a first surface and a second surface. A plurality of grooves spaced apart from each other are etched from the first surface of the silicon substrate. A dielectric material is deposited on the first surface of the silicon substrate and into the plurality of grooves. A hole through the silicon substrate is etched from the second surface of the substrate to the dielectric material. A portion of the hole is located between the plurality of grooves.

4 Claims, 13 Drawing Sheets

SILICON SUBSTRATE FABRICATION

CROSS REFERENCE TO RELATED APPLICATIONS

Reference is made to commonly-assigned, U.S. patent application Ser. No. 13/860,560, entitled "SILICON SUBSTRATE MEMS DEVICE", filed concurrently herewith.

FIELD OF THE INVENTION

This invention relates generally to micro-fluid ejection assemblies and, in particular, to ejection devices having flow features formed therein using Micro-Electrical-Mechanical Systems (MEMS) processing techniques.

BACKGROUND OF THE INVENTION

Micro-fluidic ejection devices typically include a silicon substrate material that includes "flow features," for example, fluid openings, fluid passages, holes, trenches, or depressions, formed therein. These flow features may be formed by a wide variety of micromachining techniques including sand blasting, wet chemical etching and reactive ion etching. As these devices become smaller, such as for ink jet printhead applications, micromachining of the substrates becomes a more critical operation.

One micromachining technique of particular interest is a silicon dry etch technique known as Deep Reactive Ion Etch (DRIE). DRIE has the potential to create deep and narrow holes through a silicon wafer. DRIE can routinely produce aspect ratios as high as 25:1, which can be critical in creating holes that are closely spaced, such as is needed for high-resolution ink jet printhead devices. DRIE goes by many names in the literature; however, herein we are referring specifically to the Bosch process that features sequential ionic plasma etch and passivation layer deposition. This technique offers high drilling rates with vertical sidewalls and high aspect ratio (height/width).

Some of the drawbacks of the DRIE process include an aspect ratio dependent etching rate. This means that the rate of drilling is slower for small diameter holes than it is for larger diameter holes. Variability in etching rate is also found when comparing holes made in the center of the silicon wafer to the edges of the wafer (commonly referred to as the bulls-eye effect). Microloading is another known issue in which isolated holes will drill somewhat faster than holes that are situated nearby to other holes. When holes are being drilled all the way through the silicon wafer from one surface to the other, these rate differences may not matter too much. However, certain MEMS applications require that a silicon substrate have holes that are drilled down to an insulating layer, which serves as an etch stop or as a device functional layer. When hole drilling stops at an insulating layer on the surface of the wafer, such as is found in Silicon on Insulator (SOI) substrates, variability in the etch rate often leads to additional defects.

In particular, when SOI wafers are etched using DRIE, notching occurs. Referring to FIG. 9*a*, notching, which is present in region 930, is the phenomenon of localized undercutting of the silicon at the silicon/insulator boundary. It is widely believed that this phenomenon is caused by local charging of the insulating layer 960 by plasma ions in region 980 which causes lateral deflection of the ionic species resulting in lateral etching of the sidewalls in region 930. Notching can also be understood, more elementarily, as caused by over etching, especially where some of the holes in a wafer reach the insulating layer before the etching process is complete due to etching rate variability described previously.

A number of countermeasures to reduce or even prevent notching have been proposed. One widely used technique is to observe when the hole approaches the insulating layer and then alter the DRIE parameters to reduce the etching rate. This approach works well when there are uniform hole etching rates, but even then, requires difficult or complex monitoring techniques to know when to reduce the etch rate without unduly sacrificing productivity.

Several approaches using changes in pulse duty cycle or frequency have been found to reduce notching, but changes in optimized etching process parameters are likely to have a negative impact on etching characteristics such as etch rate or anisotropy. Another approach is to add a metallization layer to the insulator to avoid charge build up, but that adds manufacturing complexity, especially if that metal layer must be removed after the DRIE is complete.

As such, there is an ongoing need to develop a solution in which the insulating layer itself reduces or even prevents notching preferably without adding additional complexity or cost to the process or the finished product.

SUMMARY OF THE INVENTION

According to an aspect of the invention, a method of etching a silicon substrate includes etching a plurality of grooves spaced apart from each other on a first surface of a silicon substrate. A dielectric material is deposited on the first surface of the silicon substrate and into the plurality of grooves. A hole is etched through the silicon substrate from the second surface of the substrate to the dielectric material. A portion of the hole is located between the plurality of grooves. The dielectric material in the grooves acts to stop the lateral etching that contributes to notching, thereby reducing, limiting, or even preventing a notching defect in the silicon substrate.

According to another aspect of the invention, the starting location and size of the hole on the second surface of the silicon wafer are determined by providing a mask on the second surface of the silicon substrate prior to etching the hole through the silicon substrate from the second surface of the substrate to the dielectric material. The mask defines the hole diameter which is smaller than the spacing between the grooves. The mask is aligned relative to the plurality of grooves so that etching through the silicon substrate from the second surface of the substrate creates a through hole that is aligned with respect to the plurality of grooves.

According to another aspect of the invention, at least a portion of the dielectric material located between the plurality of grooves can be removed either prior to or after completion of the hole formation. In one example embodiment of the invention, the plurality of grooves, formed to contain the dielectric material by acting to stop lateral etching, can be distinct portions of a continuous groove. The continuous groove can have various shapes including, for example, a rectangle with rounded corners, an oval, or a circular shape when viewed from a direction perpendicular to the first surface of the silicon substrate.

BRIEF DESCRIPTION OF THE DRAWINGS

In the detailed description of the example embodiments of the invention presented below, reference is made to the accompanying drawings, in which.

DETAILED DESCRIPTION OF THE INVENTION

Deep dry etching of silicon is now a routine process in MEMS fabrication. Deep Reactive Ion Etching uses sequential etch and deposition steps. The etching step uses an isotropic plasma etch, typically using sulfur hexafluoride, $SF_6$, for silicon. Sulfur hexafluoride gas is injected into a low-pressure chamber, containing the silicon wafer to be processed, and then energized with a spark discharge to create a plasma, which contains ions. The wafer is typically coated with a photoresist mask, which is resistant to ion etching, to define the regions where the hole is to be drilled. Gaps in the mask determine the location and size of the etched hole.

As the etching proceeds, a cycle of etching and passivation is used to achieve the high aspect ratio desired to drill small holes through a relatively thick silicon wafer. Typical chemically inert passivation materials include fluorocarbons, similar to Teflon™. The coating of the hole by the passivation layer discourages the sidewalls of the hole from further etching through the protected layer. However, the directional bombarding ions erodes the passivation layer at the bottom of the hole resulting in further etching of the silicon in the vertical direction. These etch/deposit steps are repeated many times over resulting in a large number of very small isotropic etch steps taking place only at the bottom of the etched pits. The end result is a deep, narrow hole or trench.

Figure 9A:
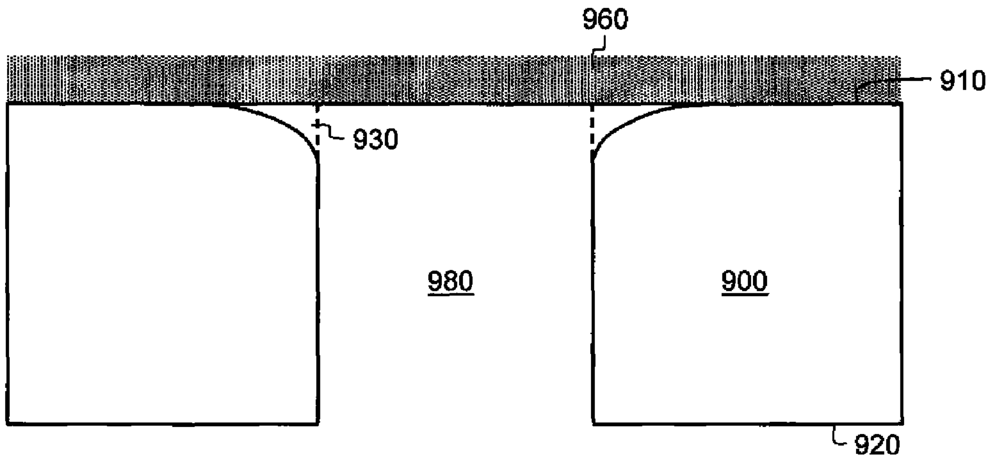
FIG. 9a (PRIOR ART)
FIGS. 9*a* and 9*b* are cross-sectional views of prior art devices.
Figure 9B:
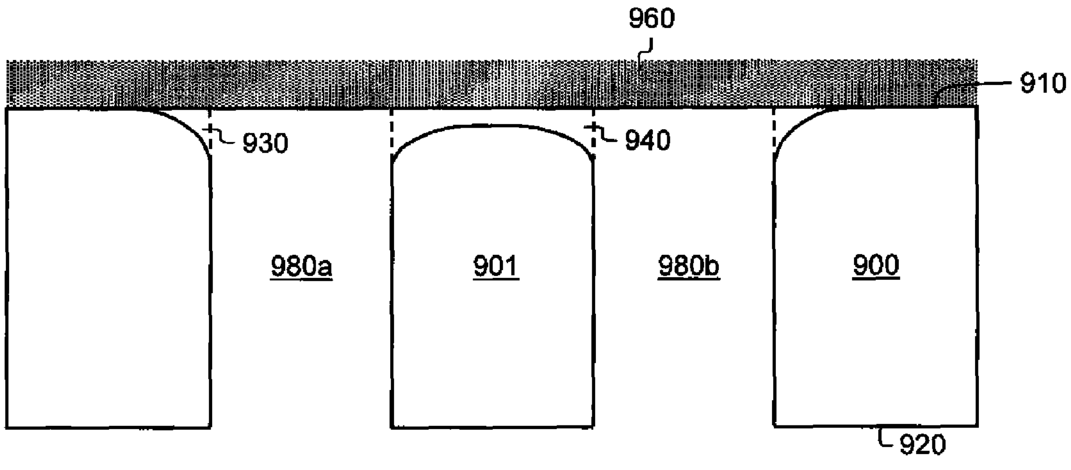
FIG. 9b (PRIOR ART)

Charge build up in the bottom of the holes or the sidewall of the holes is prevented by the inherent conductivity of silicon which allows charge deposited (or induced) by the ionic species to bleed away or be neutralized by counter charge in the wafer walls. As a result, the ionic bombardment of the plasma $SF_6$ proceeds as expected throughout the growth of the hole. In the presence of an insulating layer, which, for example, might be present on the backside of the wafer, the deposited charge can accumulate. The resulting change in the electric field in the hole can then drive the reactive ions into the side walls resulting in lateral erosion or notching (also referred to as footing). FIGS. 9*a* and 9*b*, described in more detail below, show examples of lateral erosion or notching.

In the case of a single hole being drilled in a silicon wafer, adjustment to the etch rate as it approaches the insulating layer can reduce or ultimately prevent notching if the etch process is promptly stopped when the hole is complete. As described earlier, however, in the more typical case where many holes are being fashioned at the same time in a wafer; and especially if there is variation in the hole sizes, density and radial location on the wafer, some holes will be complete and starting to notch while other holes are still not complete. This means that simply adjusting the etch process can not completely prevent notching.

Figure 1:
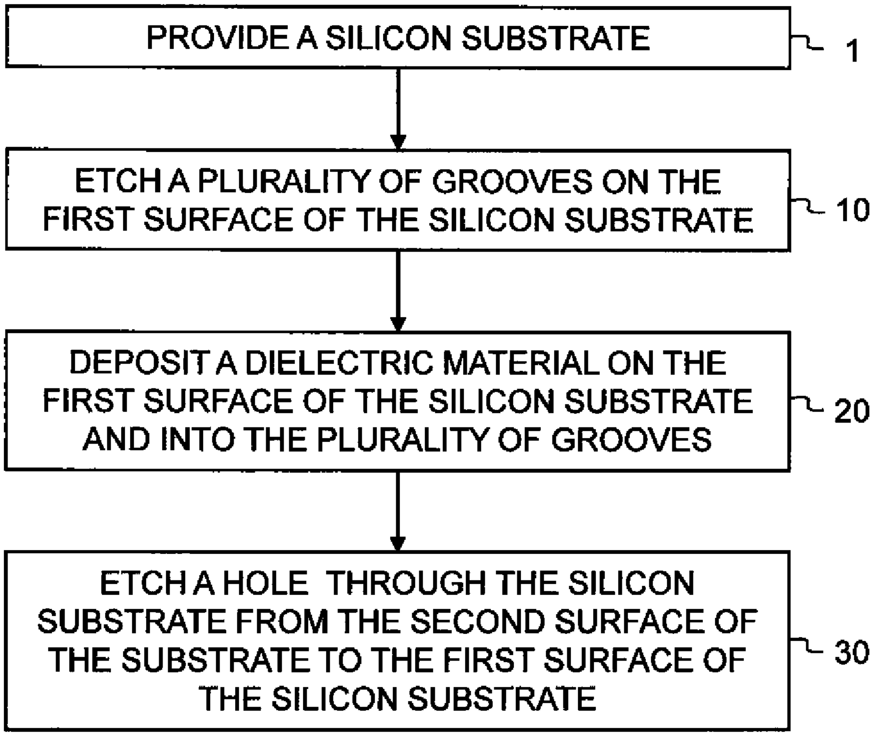
FIG. 1 is a flow chart describing process steps for etching a silicon substrate according to an example embodiment of the invention.

In addition to being an insulating layer, the dielectric layer present in Silicon on Insulator (SOI) devices or as membranes in MEMS devices is typically resistant to dry etching. Thus, it has been determined that in the present invention, the dielectric layer can act as a stop for the vertical etching. Referring to FIG. 1, a flow chart is shown describing the steps of one example embodiment of the invention for etching a silicon substrate, in which the dielectric layer also helps to reduce or even prevent notching.

The process begins with providing the silicon substrate, step 1. Then, a plurality of shallow grooves is produced on the first surface of the silicon substrate, typically using, for example, a photoresist mask and a wet etch process, step 10. Then, a dielectric material is deposited onto the first surface of the substrate, step 20. The dielectric layer can be deposited using any standard process. For example, spin coating can be used when materials such as spin-on-glass (SOG) are being deposited. The dielectric material also can be deposited using other systems and techniques. For example, vapor deposition systems and techniques including chemical vapor deposition (CVD) and atomic layer deposition (ALD) can be used. The dielectric material also can be deposited using sputtering or reactive sputtering techniques. The dielectric material can be organic or preferably inorganic. Useful inorganic dielectric materials include SiO2, TiO2, SiC, Si3N4, ZrO, TaO, and others known in the art. Because of the presence of the grooves, the dielectric material also fills the plurality of grooves, step 20. The dielectric material can completely fill the grooves, as shown in FIGS. 2 and 3, or only coat the walls of the grooves, leaving a portion of the groove unfilled. The location of the grooves on the first surface of the substrate must be aligned with the location of the holes in the dry etch mask on the second surface of the substrate. It is immaterial in which order the masks on the first and second surface of the substrate are created. Standard techniques exist, that are well known in the art, to align first and second surface masks (commonly referred to as front and backside masks). With the second surface of the substrate mask in place and the first surface of the substrate grooves coated with dielectric, the holes can now be etched through from the second surface of the substrate to the first surface of the substrate using DRIE, step 30.

Figure 2E:
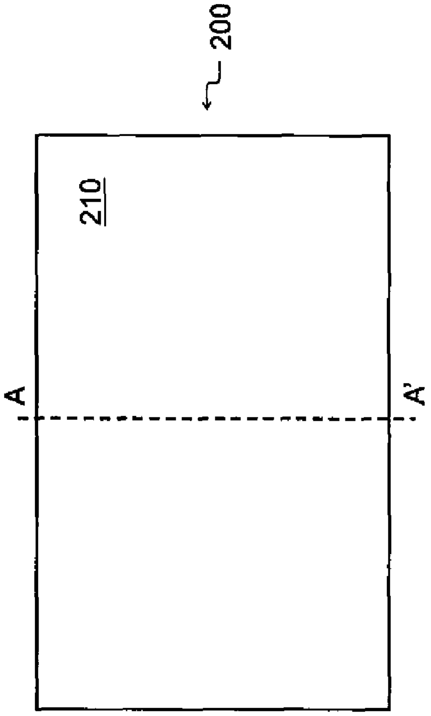
FIGS. 2*a* through 2*d* and 2*e* through 2*h* are cross-sectional views, taken along line A-A', and plan views, respectively, of one example embodiment of the invention showing formation of a silicon structure with a through hole.
Figure 2F:
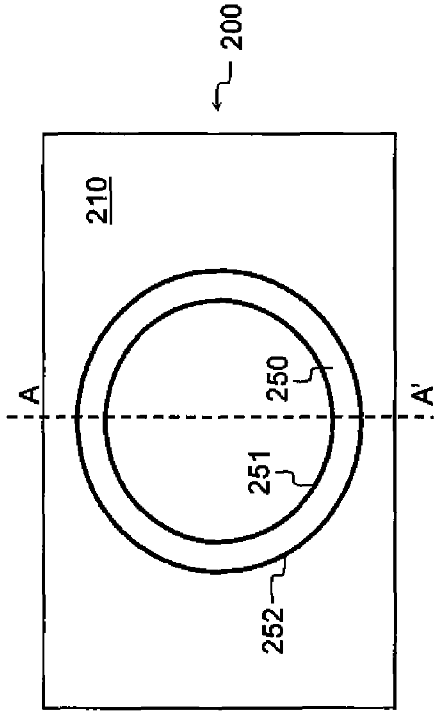
Figure 2A:
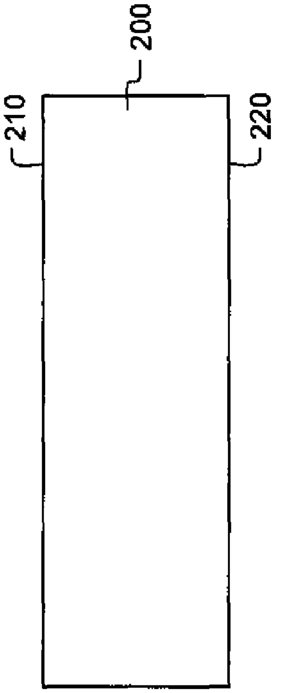

FIGS. 2*a*-2*d* and 2*e*-2*h* are cross-sectional views, taken along line A-A', and plan views, respectively, of one example embodiment of the invention showing formation of a silicon structure including a hole through the silicon wafer 200. FIGS. 2*a*-2*c* and 2*e*-2*g* show the formation of dielectric coated grooves on the first surface of the substrate. FIGS. 2*a* and 2*e* show silicon wafer 200 before processing. This corresponds to step 1 of FIG. 1. The first surface of the substrate 200 is labeled 210 and the second surface of the substrate is labeled 220.

Figure 2B:
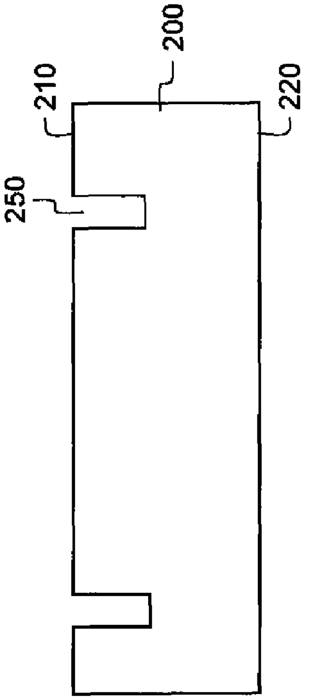
Figure 2C:
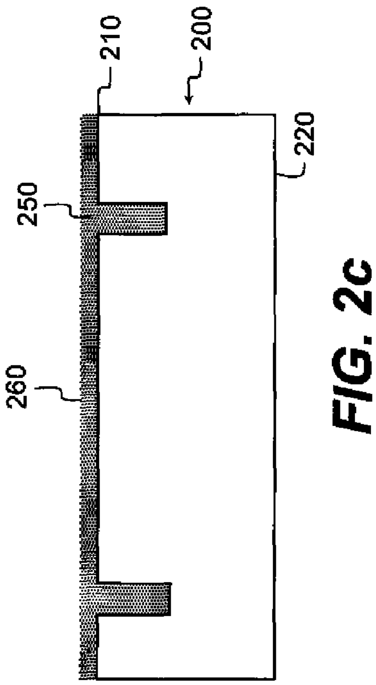

FIGS. 2*b* and 2*f* show the wafer after the etching process in complete to produce the plurality of grooves 250 in the first surface 210 of the silicon substrate. This corresponds to step 10 of FIG. 1. FIGS. 2*c* and 2*g* show the first surface 210 now coated with the dielectric layer 260. As shown in FIGS. 2*c* and 2*g*, dielectric layer 260 readily flows into grooves 250. This is a necessary characteristic of the dielectric material to enable the present invention. This corresponds to step 20 of FIG. 1.

Figure 2D:
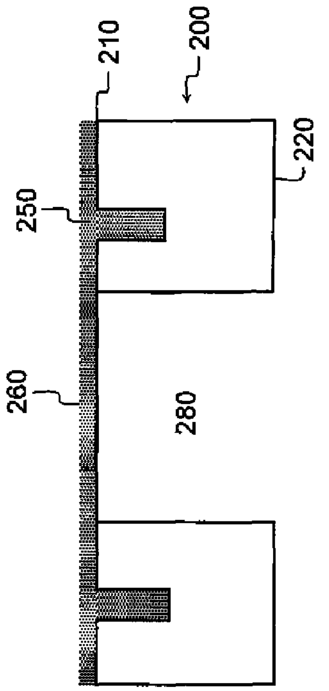
Figure 2G:
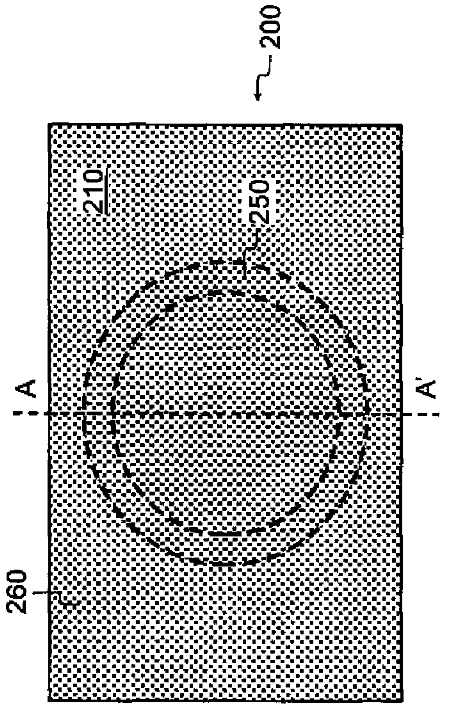
Figure 2H:
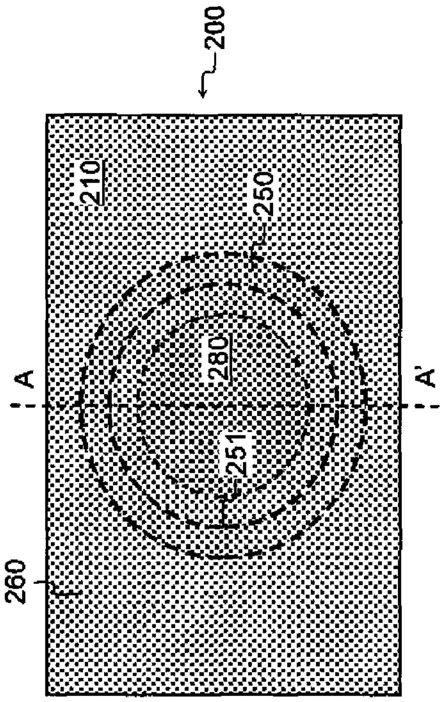

FIGS. 2*d* and 2*h* show the finished wafer after the hole 280 is drilled using DRIE from the second surface 220 of the substrate 200 to the first surface 210 of the substrate 200. The DRIE stops where it contacts the dielectric layer 260. This corresponds to step 30 of FIG. 1. Details of the prevention of notching by the dielectric in the grooves will be discussed later. As shown in FIG. 2*d*, the entirety of hole 280 is contained within the boundary defined by the inner surface 251 of the groove 250. This is an essential feature of the first embodiment of the invention.

FIGS. 3*a*-3*e* and 3*f*-3*j* are cross-sectional views, taken along line A-A', and plan views, respectively, of another example embodiment of the invention showing formation of a silicon structure with a through hole through the silicon 300 and the dielectric layer 360. FIGS. 3*a*, 3*b*, 3*c*, 3*f*, 3*g*, and 3*h* are identical to FIGS. 2*a*, 2*b*, 2*c*, 2*e*, 2*f*, and 2*g*.

Figure 3A:
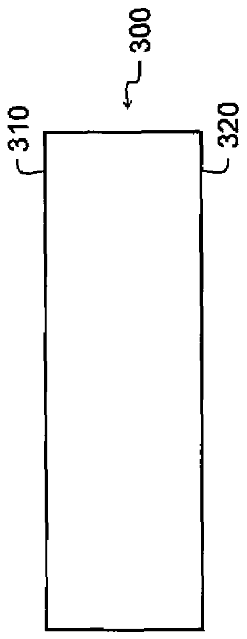
FIGS. 3*a* through 3*e* and 3*f* through 3*j* are cross-sectional views, taken along line A-A', and plan views, respectively, of another example embodiment of the invention showing formation of a silicon structure with a through hole.
Figure 3B:
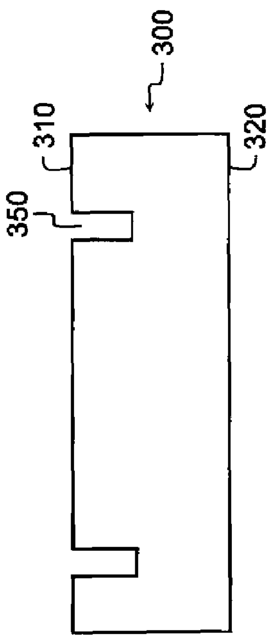
Figure 3F:
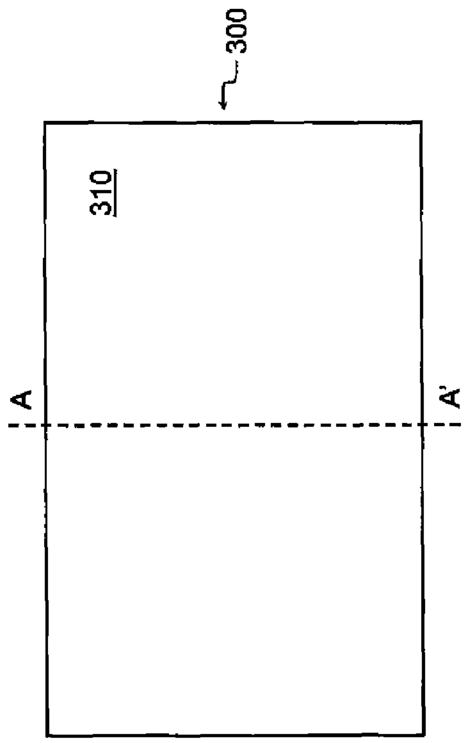
Figure 3G:
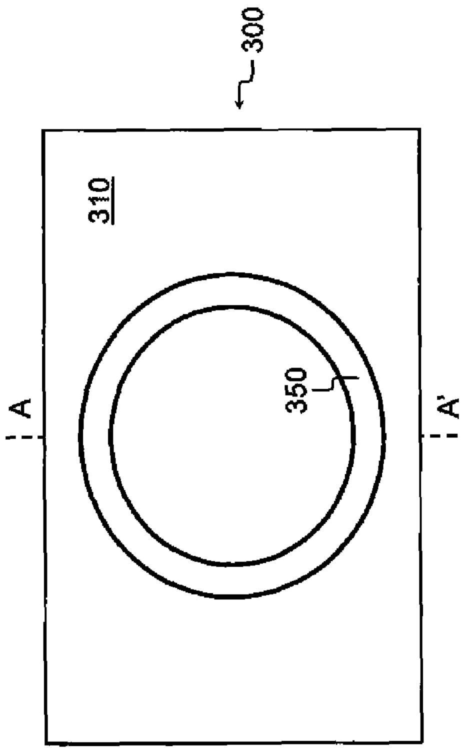
Figure 3H:
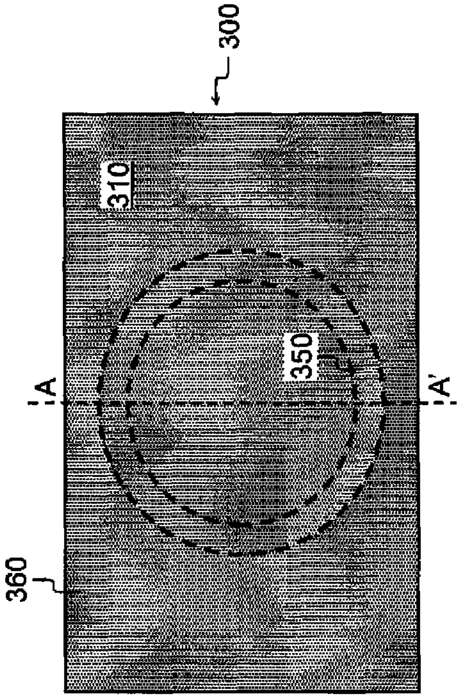
Figure 3I:
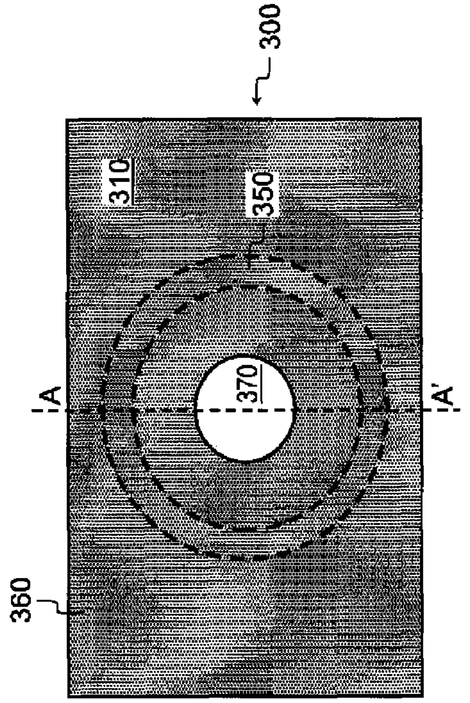
Figure 3C:
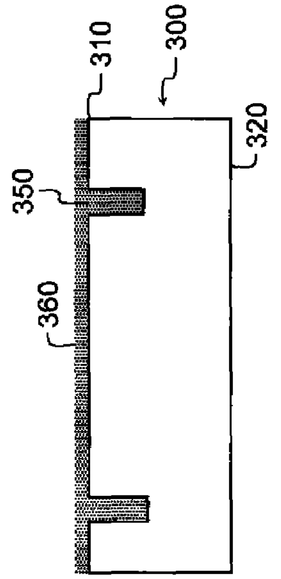
Figure 3D:
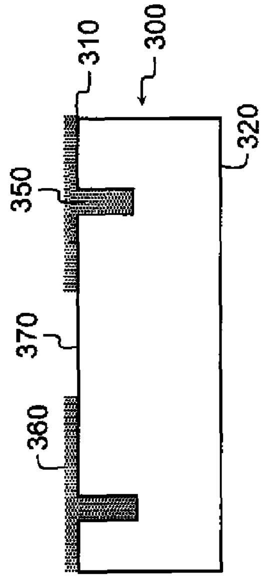
Figure 3E:
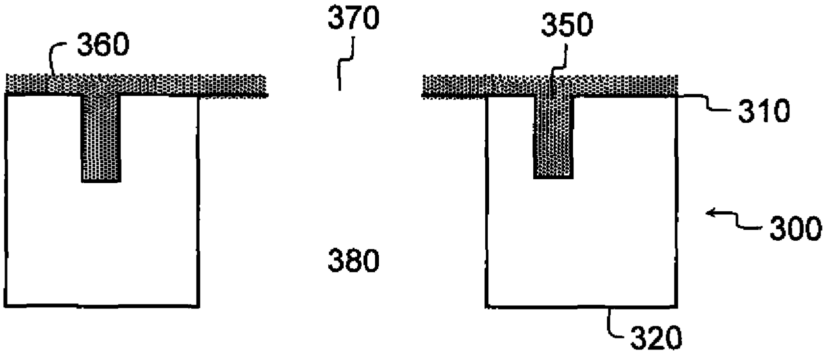
Figure 3J:
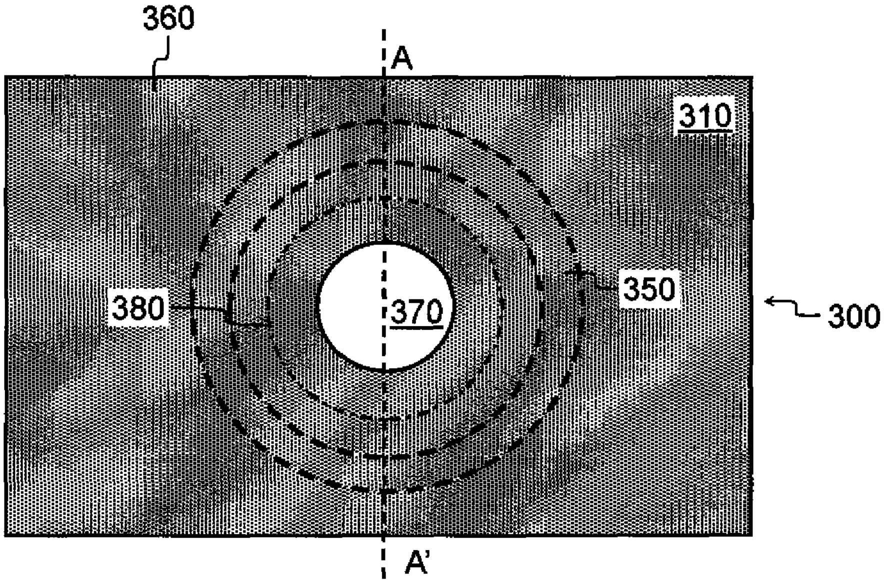

FIGS. 3*d* and 3*i* show the formation of a small hole 370 in the dielectric layer 360. Hole 370 is formed by a conventional process, for example, mask formation, wet etching, and mask removal. After creation of the through hole 370, the DRIE process then forms hole 380 starting from the second surface 320 of the silicon substrate 300. Alternatively, hole 380 can be formed first, followed by the formation of hole 370. The resulting structure, shown in FIGS. 3*e* and 3*j*, has many applications. For example, the structure shown in FIGS. 3*e* and 3*j* can be used in fluidic devices including, for instance, ink jet printheads. FIG. 3*j* shows the concentric and size relationship of the membrane through hole 370, the silicon through hole 380 and the groove 350 for this example embodiment.

Figure 4:
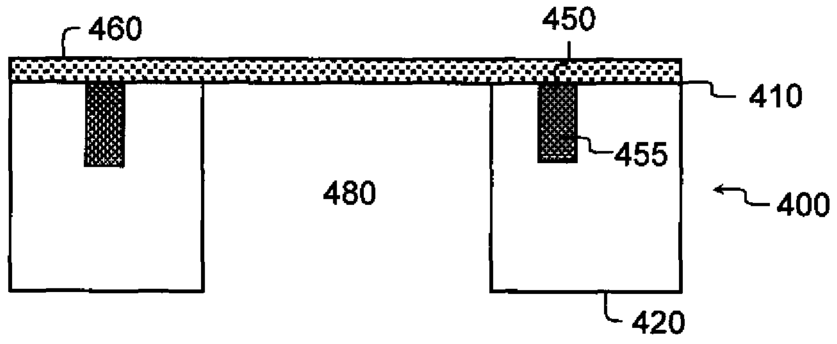
FIG. 4 is a cross sectional view of an example embodiment of a MEMS device of the invention.

Referring to FIG. 4, another example embodiment of a MEMS device of the present invention is shown. This embodiment is similar to the structure shown in FIG. 2*d* which included a suspended dielectric membrane 460 over a deep hole 480 in the silicon substrate. In the embodiment shown in FIG. 4, however, the grooves 450 are coated with a different notch stop material 455 than used for the membrane. This is advantageous in cases where there are other material deposition and patterning steps prior to the deposition and patterning of the membrane material. The notch stop material can be a dielectric material and serves the same function as the dielectric coated grooves discussed above. The pattern for the additional notch stop material can be identical to that of the grooves, as shown in FIG. 4, or may be different as long as the notch stop material 455 coats the walls of the groove 450.

Figure 5:
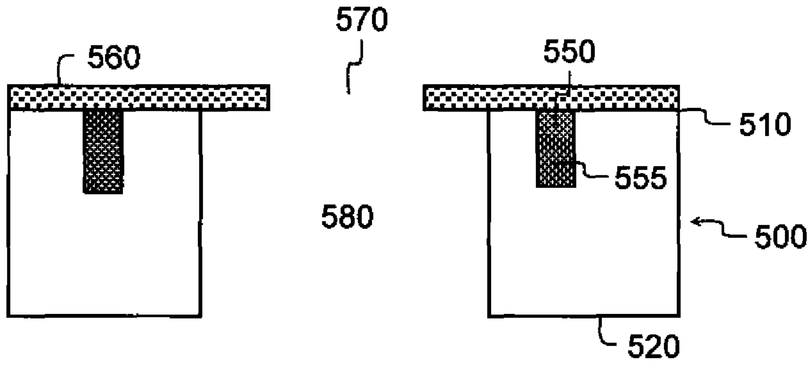
FIG. 5 is a cross sectional view of another example embodiment of a MEMS device of the invention.

Referring to FIG. 5, another example embodiment of a MEMS device of the present invention is shown. This embodiment is similar to the structure shown in FIG. 3*e*. In the embodiment shown in FIG. 5, however, a suspended dielectric membrane 560 includes through hole 570 in the membrane that is over (as shown in the figure) and aligned with a through hole 580 in the silicon substrate. In the embodiment shown in FIG. 5, the grooves 550 are coated with a different notch stop material 555 than used for the membrane. As discussed with reference to FIG. 4, this is advantageous in cases where there are other material deposition and patterning steps prior to the deposition and patterning of the membrane material.

Figure 6A:
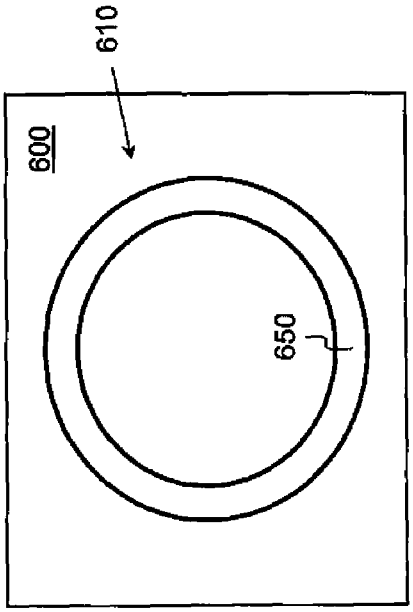
FIGS. 6*a* through 6*d* are plan views of example embodiments of the plurality of grooves of the invention.
Figure 6B:
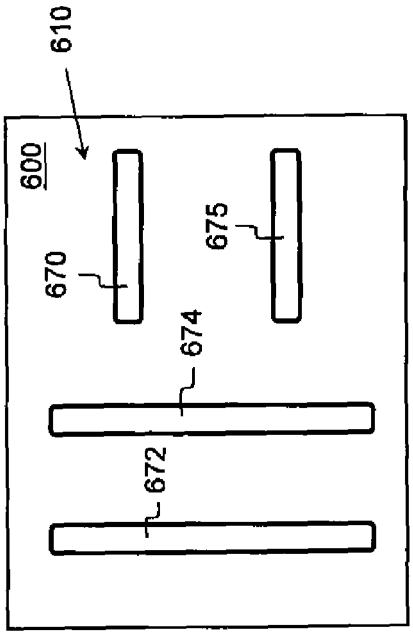
Figure 6C:
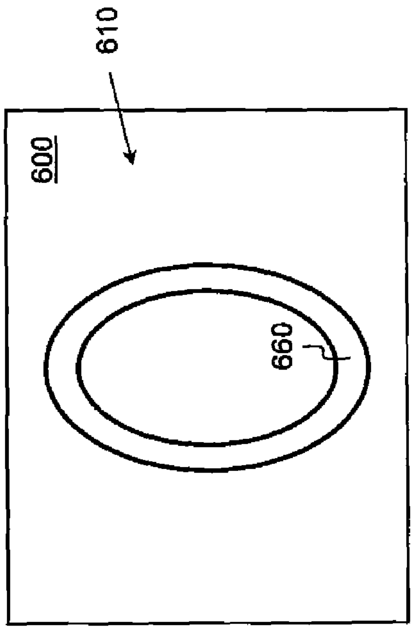
Figure 6D:
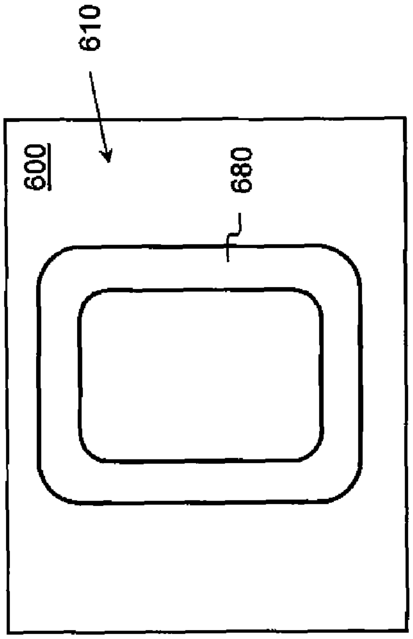

The present invention contemplates various patterns for the plurality of grooves on the first surface of the silicon substrate that can be effective for reducing or even preventing notching. Referring to FIGS. 6*a*-6*d*, plan views of example embodiments of the plurality of grooves of the present invention are shown. In FIGS. 6*a*, 6*c* and 6*d*, example embodiments are shown in which the plurality of grooves is distinct portions of a continuous groove. FIG. 6*a* shows a circular groove 650 in the first side 610 of the silicon wafer 600. Circular grooves have the advantage of reducing the size of the groove for a given radius of the groove pattern. Referring back to FIG. 2*h*, the entirety of the hole 280 must be inside the inner wall of the groove 251. A concentric groove circle and deep hole will accomplish this provided that the expected tolerance stack up errors on alignment of the front side and back side masks are within acceptable limits. FIG. 6*c* shows an oval shape for the groove. This is particularly useful when there is a known tolerance issue that is greater in one direction (for example, the vertical direction as shown in FIG. 6*c*) when compared to the orthogonal direction (the horizontal direction as shown in FIG. 6*c*). FIG. 6*d* shows a rectangular shape with curved corners for the groove pattern that increases the tolerance for alignment errors at the expense of slightly longer groove paths which can result in a greater quantity of dielectric material being used to coat or fill the grooves. The rectangular shape is also suitable for applications where the deep drilled hole itself has a rectangular shape, as shown, for example, in FIG. 7*b*.

In some MEMS applications, it is desirable to create features with deep trenches rather than holes. This is easily done using DRIE by simply changing the mask pattern for the deep hole on the second surface of the silicon substrate. When it is desired to create or drill deep trenches, groove patterns, for example, one of the patterns shown in FIG. 6*b*, are appropriate for trenches when compared to holes. It should be understood that there are variations and modifications of groove patterns that are within the scope of the present invention.

Figure 7B:
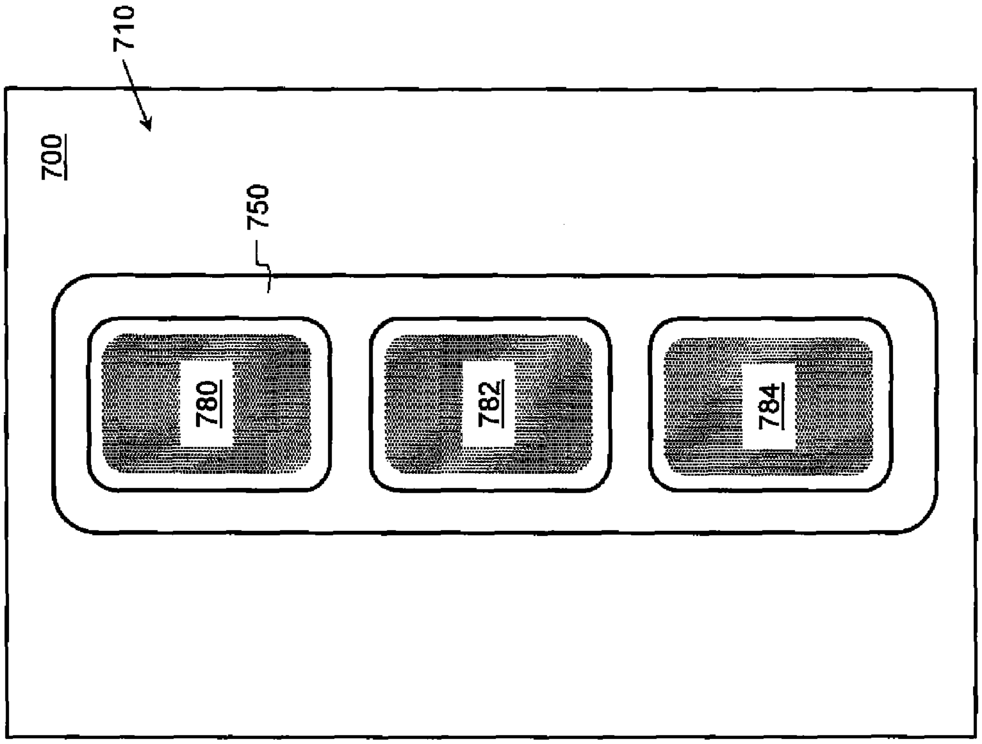
FIGS. 7*a* and 7*b* are plan views of another example embodiment of a MEMS device of the invention.
Figure 7A:
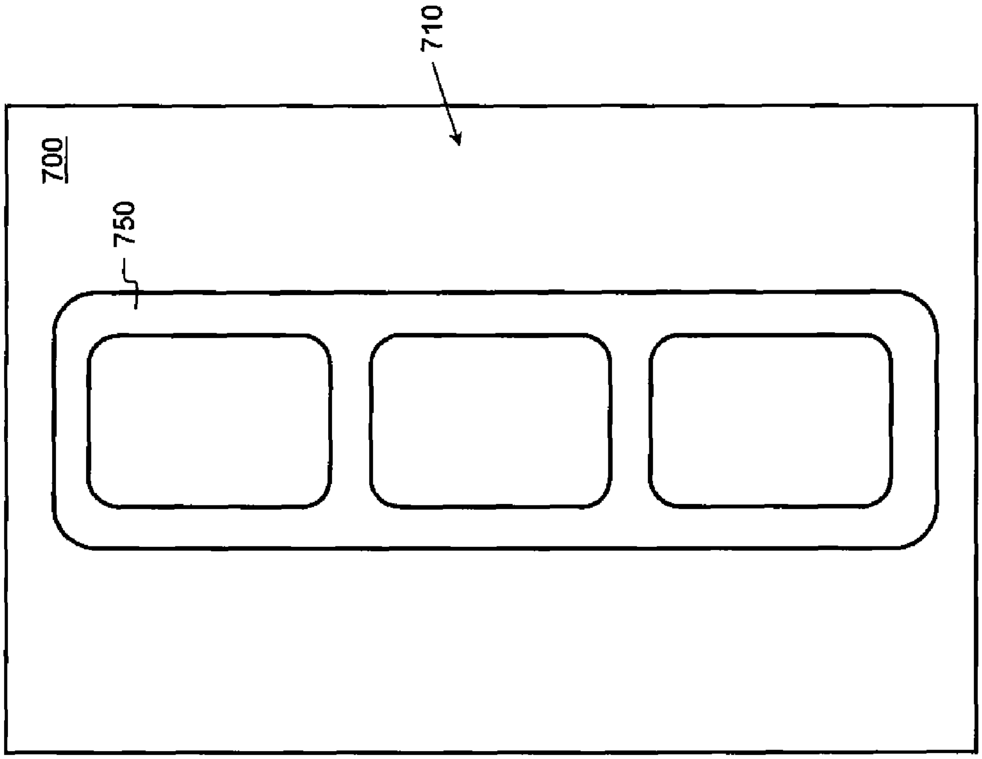

In many MEMS applications, holes or trenches are not created in isolation. For example, many fluidic devices, including most ink jet printheads, include an array of closely spaced holes. In this case, as well as other similar designs, a series of interconnected grooves 750 can be provided, or created, for the first surface 710 of the silicon substrates 700 shown in FIGS. 7*a* and 7*b*. The interconnected plurality of grooves 750 on the first surface 710 of silicon substrate 700 are shown in FIG. 7*a*. FIG. 7*b* shows the series of deep etch holes 780, 782, 784. As shown in FIGS. 7*a* and 7*b*, the grooves and the holes include a rectangular aspect although other shapes can be used depending on the application contemplated.

Referring now to FIG. 8, an example embodiment that addresses a significant practical issue in using dielectric filled grooves to reduce or even prevent notching is shown. In applications, the tolerance stack up error for aligning the grooves on the first surface of the silicon substrate to the hole produced using DRIE and a mask on the second surface of the silicon substrate can be large enough to be potentially problematic. Referring back to FIG. 2*d*, if the deep hole 280 is sufficiently off center when compared to the groove 250, there is a risk that a portion of the hole will reach the first side of the wafer beyond the inner boundary 251 of the groove 250. If this were to happen, substantial notching can occur. If, on the other hand, the groove diameter is made much larger so as to preclude the possibility of the hole location 280 exceeding the boundary 251 of groove 250, the dielectric can be too far from the edge of the hole to reduce or prevent substantial notching. In other words, the distance from the outer edge of the hole 280 to the inner edge, the boundary 251, of the groove 250 can be greater than the extent of notching that occurs.

Figure 8A:
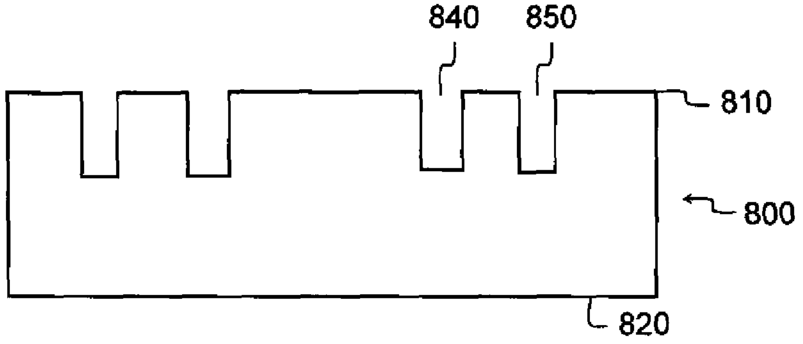
FIGS. 8*a* and 8*b* are a cross-sectional view, taken along line A-A', and a plan view, respectively, of another example embodiment of a MEMS device of the invention.
Figure 8B:
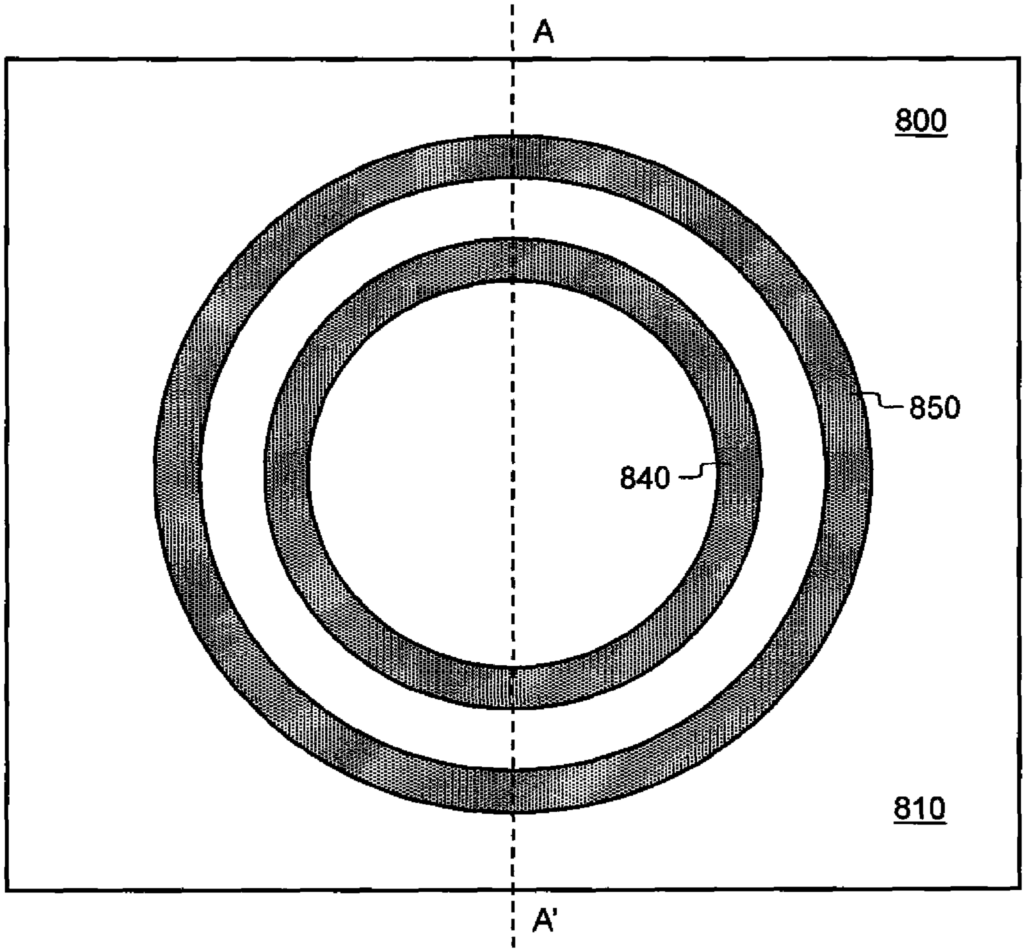

FIGS. 8*a* and 8*b* are a cross-sectional view, taken along line A-A', and a plan view, respectively, of a portion of another example embodiment of a MEMS device of the present invention that provides an additional countermeasure to this tolerance issue. As shown, an inner groove 840 helps to insure that the location of the notch preventing dielectric will be sufficiently close to the outer surface of the deep hole. In the event that the deep hole in some locations is located outside of the groove 840, the hole will still be contained inside the outer groove 850 so as to reduce or prevent notching from occurring regardless of the tradeoff between tolerance stack-up and size of the groove.

The following discussion provides an explanation for the mechanism of how the dielectric filled grooves reduce or even prevent notching. This explanation, however, should not be considered as in any way restricting the scope of the present invention. FIGS. 9*a* and 9*b* are cross-sectional views of prior art examples that include notching. FIG. 9*a* shows a single hole 980 in a SOI device in which over-etching has caused severe notching in region 930 under (as shown in the figure) the dielectric material 960. FIG. 9*b* shows an example of a failure effect that can result from notching. In FIG. 9*b*, there are two closely spaced holes 980*a* and 980*b* that are not supposed to be in fluidic communication. The portion 901 of the silicon wafer 900 separating the holes 980*a*, 980*b* is supposed to prevent fluidic communication. As shown, however, the center post 901 has been sufficiently eroded in region 940 due to severe notching 930 in region 940 to allow fluid to pass from one passage 980*a* to the other passage 980*b*.

Figure 10A:
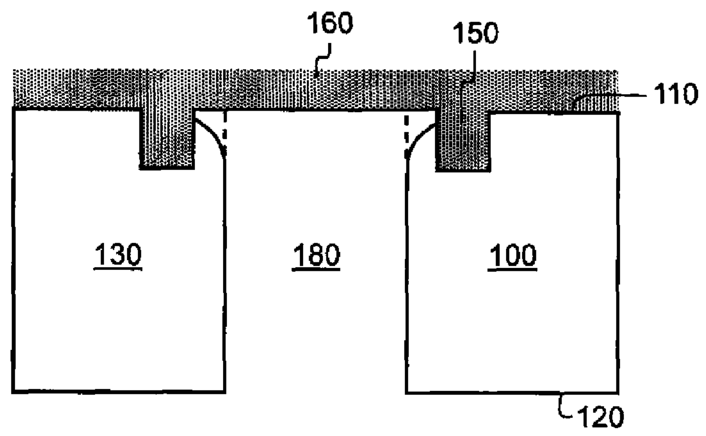
FIGS. 10*a* through 10*d* are cross-sectional views of example embodiments of MEMS devices of the invention.
Figure 10B:
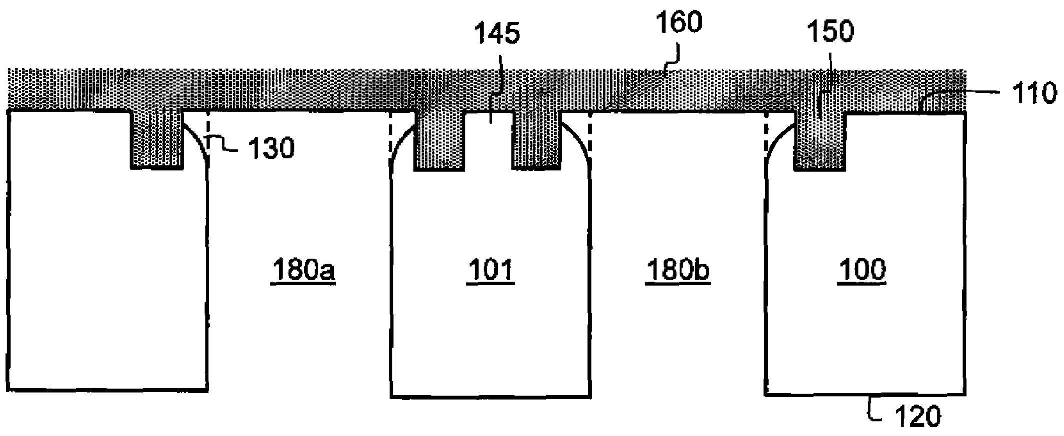

Referring to FIGS. 10*a*-10*d*, cross-sectional views of example embodiments of MEMS devices of the present invention are shown which overcome the issues associated with the prior art devices. Although the insulating nature of the dielectric layer contributes to the lateral deflection of the plasma ionic species in DRIE, the dielectric material itself is highly resistant to etching. As shown in FIG. 10*a*, when the lateral erosion that results in notching reaches the inner side wall of the dielectric filled groove, it is stopped from proceeding any further by the resistance of the dielectric to the etching. In this sense, notching of the silicon is not actually prevented, but the extent of the notching is limited or reduced. FIG. 10*b* shows how effective this can be to effectively prevent the kind of failure effect shown in FIG. 9*b*. In FIG. 10*b*, the grooves in the inner post 101 of the silicon wafer 100 effectively prevent the notching from proceeding across the entire top of the center post 101. Thus, region 145 of silicon wafer 100 is protected and fluidic separation between the holes 180*a* and 180*b* is maintained.

Figure 10C:
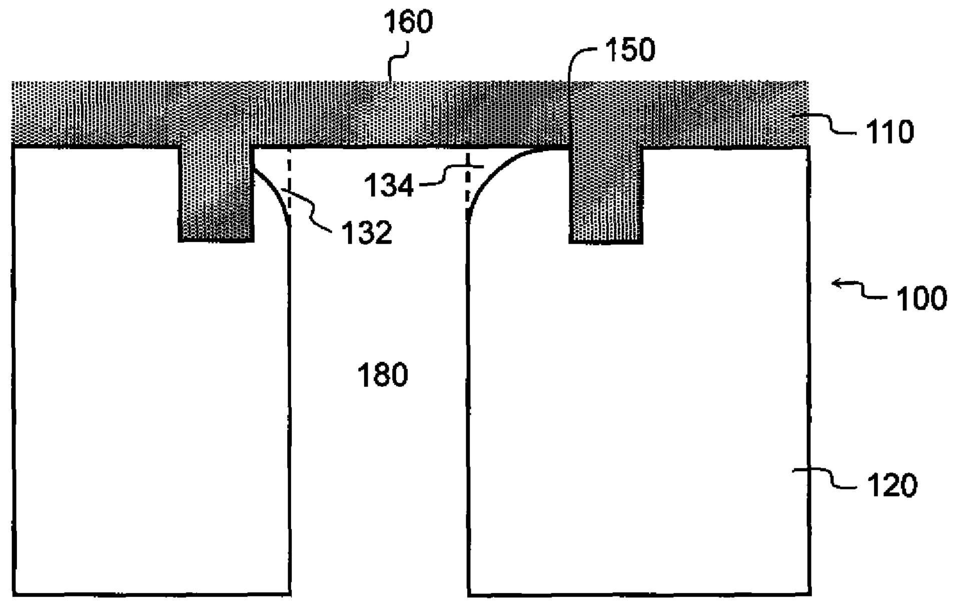
Figure 10D:
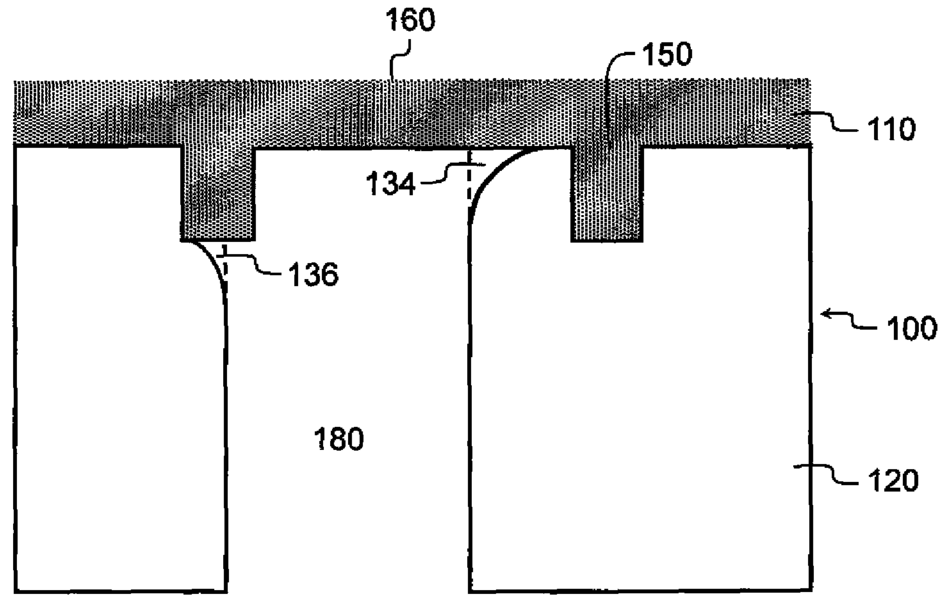

FIG. 10*c* illustrates the result when the tolerance issues are considered. As shown, hole 180 is somewhat off-center compared to the groove pattern 150. As a result, notching still occurs in region 134 but is controlled in region 132. While this can be undesirable in some applications, it typically does not result in a failure mode, since the notching is reduced or contained within acceptable limits. FIG. 10*d* illustrates a more severe tolerance issue in which notching in region 136 is about to escape the confines of the groove 150. In this situation, a second groove pattern, outside of the first groove pattern (as shown in FIGS. 8*a* and 8*b*) helps to contain the notch.

The invention has been described in detail with particular reference to certain preferred embodiments thereof, but it will be understood that variations and modifications can be effected within the scope of the invention.

PARTS LIST

1 step
10 step
20 step
30 step
100 silicon substrate
110 first surface
120 second surface
130 notch stopped on groove
132 notch stopped on groove
134 notch offset from groove
136 notch under groove
145 silicon wall
150 groove
160 dielectric material
180 through hole
200 silicon substrate
210 first surface
220 second surface
250 groove
251 inner surface of the groove
260 dielectric material
280 through hole
300 silicon substrate
310 first surface
320 second surface
350 groove
360 dielectric material
370 hole
380 through hole
400 silicon substrate
410 first surface
420 second surface
450 groove
455 notch stop material
460 dielectric material
480 through hole
500 silicon substrate
510 first surface
520 second surface
550 groove
555 notch stop material
560 dielectric material
570 hole
580 through hole
600 silicon substrate
610 first surface
620 second surface
650 circular groove
650 oval groove
670,675 parallel elongated groove
672,674 parallel elongated groove
650 rounded rectangular groove
700 silicon substrate
710 first surface
720 second surface
750 continuous groove for multiple through holes
780 first through hole
782 first through hole
784 first through hole
800 silicon substrate
810 first surface
820 second surface
840 first groove
850 second groove
900 silicon substrate
910 first surface
920 second surface
930 notch
940 missing silicon wall (merged notches)
960 dielectric material
980 through hole

The invention claimed is:

1. A method of etching a silicon substrate comprising:

providing a silicon substrate including a first surface and a second surface;

etching a plurality of grooves spaced apart from each other from the first surface of the silicon substrate, adjacent grooves of the plurality of grooves having a spacing when viewed from a direction perpendicular to the first surface of the silicon substrate;

depositing a dielectric material on the first surface of the silicon substrate and into the plurality of grooves;

providing a mask on the second surface of the silicon substrate that defines a dimension of interest that is smaller than the spacing between the adjacent grooves when viewed from the direction perpendicular to the first surface of the silicon substrate, and aligning the mask relative to the plurality of grooves so that the dimension of interest is between adjacent grooves; and etching a hole defined by the dimension of interest through the silicon substrate from the second surface of the substrate to the dielectric material, the hole being contained within the confines of the adjacent grooves.

2. The method of claim 1, further comprising:

removing at least a portion of the dielectric material located between the plurality of grooves.

3. The method of claim 1, wherein the plurality of grooves are distinct portions of a continuous groove.

4. The method of claim 3, wherein the continuous groove has one of a rectangle with rounded corners, an oval, and a circular shape when viewed from a direction perpendicular to the first surface of the silicon substrate.

* * * * *